United States Patent [19]

Totsuka

[11] Patent Number: 4,651,009
[45] Date of Patent: Mar. 17, 1987

[54] CONTACT EXPOSURE APPARATUS
[75] Inventor: Masao Totsuka, Ohmiya, Japan
[73] Assignee: Canon Kabushiki Kaisha, Tokyo, Japan
[21] Appl. No.: 708,783
[22] Filed: Mar. 6, 1985
[30] Foreign Application Priority Data Mar. 10, 1984 [JP] Japan .................................. 59-44827

[51] Int. Cl.[4] .............................................. G21K 5/10
[52] U.S. Cl. .............................. 250/442.1; 250/492.2; 378/34
[58] Field of Search ............... 250/440.1, 442.1, 491.1, 250/492.2; 378/34

[56] References Cited

U.S. PATENT DOCUMENTS 4,467,210 8/1984 Sugihara et al. ................. 250/441.1
4,542,298 9/1985 Holden .............................. 250/440.1
4,560,880 12/1985 Petric et al. ...................... 250/442.1

Primary Examiner—Bruce C. Anderson
Attorney, Agent, or Firm—Fitzpatrick, Cella, Harper & Scinto

[57] ABSTRACT

An apparatus wherein a first thin member and a second thin member, the first thin member bearing a pattern, and the second thin member is exposed to the pattern of the first thin member. It includes a vacuum line for discharging a gas existing between the first thin member and the second thin member without close-contact therebetween, and a deivce for bringing the first and scond members into proximity close-contact with each other after said discharging means discharges the gas from between the first thin member and the second thin member.

10 Claims, 5 Drawing Figures

CONTACT EXPOSURE APPARATUS

BACKGROUND OF THE INVENTION

The present invention relates to a contact exposure apparatus wherein a member is exposed to a pattern of another member while they are in close-contact with each other, more particularly, the apparatus wherein a difference between vacuum pressure to one of the members and to the other is utilized.

Conventionally, the apparatus of this type is often used with a so-called mask aligner. FIG. 1 shows an example of such an apparatus, wherein an expansible and closed space or chamber 6 is formed between the two members which, in this case, a mask 1 and a wafer 3. The space is evacuated so that the mask 1 is bent or curved toward the wafer 3 by the atmospheric pressure exerted to the backside of the mask 1 to bring them into close-contact with each other. Since however, the gases existing in the space between the mask 1 and the wafer 3 is quickly evacuated to a high vacuum required for the desired close-contact from the atmospheric pressure, the conventional apparatus involves the following drawbacks.

Firstly, the close-contact therebetween is degraded. In the prior art apparatus, the entire surfaces of the mask 1 and the wafer 3 start contacting substantially simultaneously at all points. Then, the gases in the middle of the wafer 3 can not escape, tending to be captured there. This tendency is remarkable, particularly when the wafer 3 is processed after it has been subjected to some of many semiconductor manufacturing process steps resulting in deteriorated flatness of its surface. The gases thus captured degrade the close contact. When this occurs, the light can diffract in the fine space between the mask 1 and the wafer 3 created by the captured gases, which results in poor resolution. Thus, in the contact type exposure apparatus, the poor close-contact directly leads to poor pattern exposure. In order to vent the captured gases, the conventional apparatus is operated in such a manner that the pattern exposure operation is carried out with a delay of time after they are contacted. This, however, has been a cause of preventing the increase of throughput, that is, the number of wafers processed per unit time.

The second drawback is an increase in a pitch error. In the above described apparatus, when the mask 1 and the wafer 3 are to be contacted to each other, they are supported with a proper space therebetween, and thereafter, the closed space 6 formed therebetween is evacuated so as to allow the atmospheric pressure exerted to the backside of the mask 1 to curve the mask 1 toward the wafer 3, thus bringing them into close-contact with each other. In doing this, the initial setting of the gap or clearance between the mask 1 and the wafer 3 has a significant influence to the closeness of the contact.

More particularly, when the gap is small, the amount of curve of the mask 1 is small so that the closeness in the marginal areas is better and that the so-called pitch error is smaller. The pitch error is an error in which the mask pattern is projected slightly out of alignment with the position where it is to be projected, because the pattern of the mask 1 is expanded due to the curve of the mask 1. On the contrary, as explained hereinbefore, the closeness in the central area is rather poor because of the fine gaps created.

When, on the other hand, the amount of the gap is large, as shown in FIG. 2, the mask 1 is greatly curved, so that the contact between the mask 1 and wafer 3 starts at the central area, and the contacted area extends gradually toward marginal areas with the increase of the vacuum. Therefore, the occurrence of the captured gases in the neighborhood of the center of the mask 1 and the wafer 3 is mitigated, and therefore, the closeness of contact in the central area is increased. However, since the mask 1 is significantly curved toward the wafer 3, the pitch error is larger in this case.

Therefore, in the prior art apparatus, when the gap is increased in order to provide a better closeness of contact between the two members, such as the mask 1 and the wafer 3, a larger pitch error results; whereas if the gap is reduced in an attempt to decrease the pitch error, the poor closeness of contact results. Thus, it involves contradictory drawbacks.

SUMMARY OF THE INVENTION

Accordingly, it is a principal object of the present invention to provide a contact alignment apparatus wherein a good state of close contact is accomplished between two members.

In order to achieve this object, the present invention provides and apparatus wherein the space formed between the two members is evacuated without contacting them with each other, only then the two members are brought into contact.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
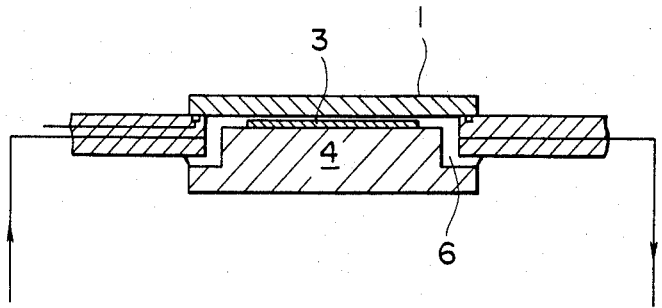
FIGS. 1 and 2 illustrate conventional contact exposure apparatus.
Figure 2:
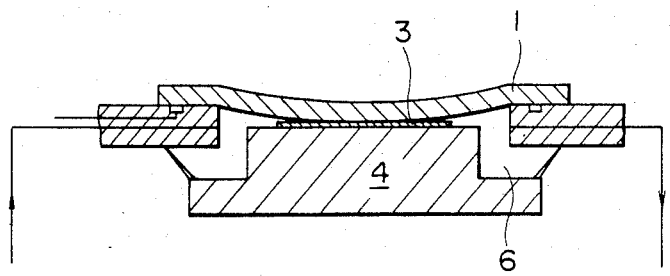
Figure 3:
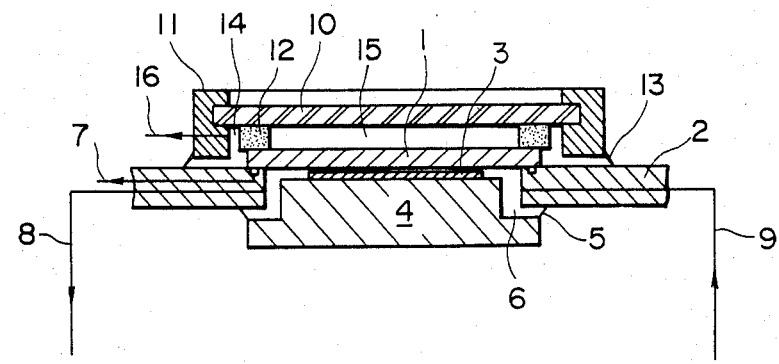
FIGS. 3 and 4 are cross-sectional views of an apparatus according to an embodiment of the present invention.

Referring now to FIG. 3, there is shown an embodiment of the present invention.

In this Figure, the reference numeral 1 designates a mask bearing information or pattern to be recorded or printed; and the reference numeral 3 designates a wafer on which the information or pattern of the mask 1 is recorded or printed. The contact exposure apparatus in this embodiment comprises a mask holder 2 for supporting the mask 1, a wafer chuck 4 for carrying thereon the wafer 3 and for firmly fixing the wafer 3 thereon by electrostatic attraction. The wafer chuck 4 is movable in the vertical direction by a driving means (not shown). However, it is not fixedly secured by a mechanism during the driving operation thereof, so that it maintains a fixed position. The apparatus further comprises a sealing member 5 in the form of a sealing rubber or the like, thus constituting a vacuum chamber 6 between the mask 1 and the wafer 3. The apparatus is further provided with a vacuum line 7 for fixing the mask 1 on the mask holder 2, a vacuum line 8 for evacuating the space between the mask 1 and the wafer 8 and a gas line 9 for supplying a gas, such as $N_2$, to the vacuum chamber 6.

A glass-like member 10 which is transparent with respect to the exposure light, that is, ultraviolet rays in this embodiment, is supported by a holder 11. The joint between the glass-like member 10 and the holder 11 is hermetically sealed. There is provided a cushion member 12, such as a rubber, and the glass-like member 10 resiliently urges the marginal area of the mask 1 through the cushion member 12. Another sealing member 13 in the form of a sealing rubber is effective to maintain the vacuum in the spaces 14 and 15, which are, therefore, closed by the mask 1, the mask holder 2, the glass-like member 10, the holder 11 and the sealing member 13. Those spaces are communicated with each other. Another vacuum line 16 is provided to evacuate the space 14 and the space 15.

The operation of the apparatus will be described.

(1) The mask 1 and the wafer 3 are placed at the respective predetermined positions. Prior to this, the sealing member 5 has been brought into contact with the bottom surface of the mask holder 2 so as to form a closed space or chamber 6 between the mask 1 and the wafer 3. However, the chamber 6 is not yet evacuated. Then, the mask 1 and the wafer 3 are brought into alignment with each other by an X-Y-Θ stage (not shown). After the completion of alignment, the mask 1 and the wafer 3 are spaced with a predetermined clearance therebetween by driving means (not shown).

(2) While the mask 1 and the wafer 3 are being maintained spaced from each other, the chamber 6 is evacuated by the vacuum line 8. Simultaneously, the spaces or chambers 14 and 15 are also evacuated through the vacuum line 16. Therefore, the chambers 6, 14 and 15 are maintained at the same vacuum. In this state, the mask 1 is pressed toward the mask holder 2 through the cushion member 12 by the atmospheric pressure exerted to the top surface of the glass-like member 10. Because of this, the mask 1 is not movable on the mask holder 2, and the mask 1 does not deform. More particularly, the opposite sides of the mask 1 are kept at the same vacuum, the forces imparted to the opposite sides are balanced, thus maintaining the flatness of the mask 1. Also, the wafer chuck 4 is not movable upwardly, rather securely fixed, so that the clearance between the mask 1 and the wafer 3 remain unchanged, and the flatness of the wafer 3 is maintained, too. With the flatness of the mask 1 and the wafer 3 maintained, the gas or gases existing in the vacuum chamber 6 and the chambers 13 and 15 are removed to such an extent that the practically sufficient vacuum condition is accomplished. Thus, the gas which may otherwise be the cause of poor closeness contact between the mask 1 and the wafer 3 is substantially completely discharged at this step.

Figure 4:
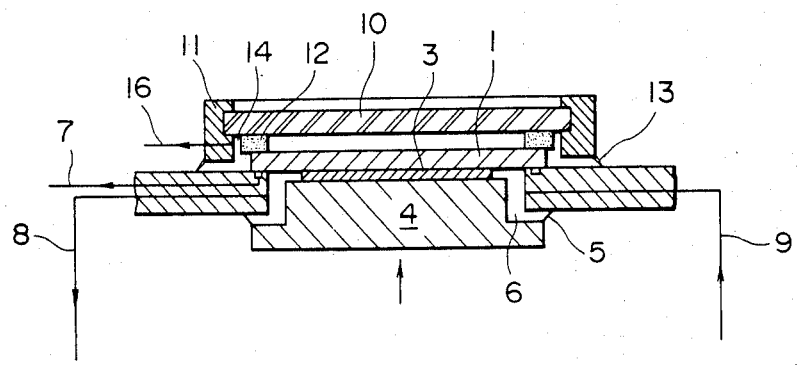

(3) Next, the wafer chuck 4 is lifted by a driving means (not shown) until the wafer 3 is contacted to the mask 1, as shown in FIG. 4. It should be noted that the compelte contact therebetween is not absolutely necessary. Rather, they may be brought into close proximity with each other with a small gap. The wafer chuck 4 may be fixed at all times, and the mask 1 may be lowered toward the wafer 3. Alternatively, both of the mask 1 and the wafer 3 may be moved toward each other. Thus, the mask 1 and the wafer 3 are brought into contact or into proximity with each other without the unnecessary gas between the mask 1 and the wafer 3.

(4) While the above contact or the proximity is being maintained, the vacuum in the spaces 14 and 15 is decreased finally to the atmospheric pressure. Then, the atmospheric pressure directly exerted to the top surface of the mask 1 so as to press the mask 1 to the wafer 3. Hence, the mask 1 and the wafer 3 are closely contacted by the atmospheric pressure. Here, the flatness of the mask 1 and the wafer 3 is maintained, and they are brought into close-contact from the state of contact or close proximity. Accordingly, there is hardly any curve in the mask 1 or the wafer 3. Even if the flatness of the wafer 3 is not good, the mask 1 is easily brought into close-contact with the wafer 3 due to the absence of unnecessary gases. It is not always necessary to release the spaces 14 and 15 to the atmospheric pressure. Smaller pressure suffices if it is enough to apply necessary force to the mask 1. Conversely, it may be higher than the atmospheric pressure. In this case, however, it is necessary to directly fix the holder 11 and the mask holder 2.

(5) After the mask 1 and the wafer 3 are close-contacted through the above-described steps (1)-(4), the accuracy of the alignment therebetween is confirmed. If the accuracy is within a predetermined tolerance, light is applied to the top surface of the mask 1 by an illuminating means (not shown), thus exposing the wafer 3 to the mask pattern through the glass-like member 10.

The close-contact exposure is completed through the above steps (1)-(5).

Figure 5:
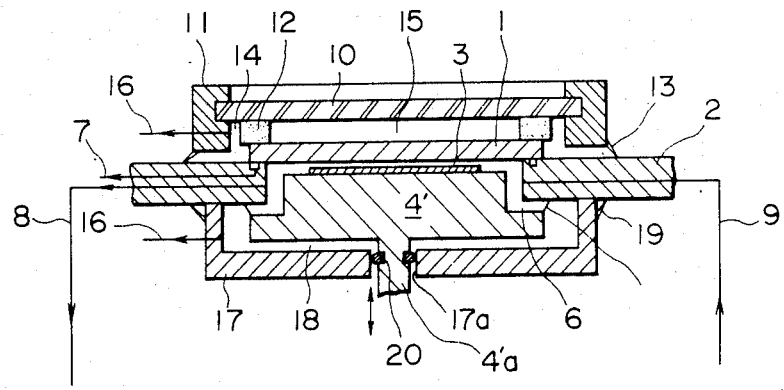
FIG. 5 is a cross-sectional view of an apparatus according to another embodiment of the present invention.

FIG. 5 shows another embodiment of the present invention. Since this embodiment is similar to the foregoing embodiment, except for the portions which will be described, the detailed description of the similar portions is omitted for the sake of simplicity by assigning the same reference numerals to the elements having the corresponding functions. In this embodiment, the wafer chuck 4' is different from the wafer chuck 4 of the FIG. 3 embodiment which is kept securely fixed by the mechanism except during its movement. The wafer chuck 4' is covered below its bottom surface by a covering member 17 which is somewhat annular. The covering member is provided with a circular opening at its center. From the center of the bottom surface of the wafer chuck 4', a rod or shaft 4'a, which is vertically movable, extends downwardly. The shaft 4'a extends through the central opening 17a' of the covering member 17. The wafer chuck 4' is resiliently joined for vertical movement to the covering member 17 by a leaf spring (not shown) or the like. A sealing member 19 is provided to hermetically seal between the covering member 17 and the mask holder 2. Another sealing member 20 is provided to hermetically seal between the shaft 4'a and the covering member 17. The sealing member 20 is annular and surrounds the shaft 4'a. Therefore, in this embodiment, a space or chamber 18 is formed by the wafer chuck 4', the covering member 17 and the sealing members 5, 19 and 20. Thus, the space 18 is hermetically sealed. The apparatus of this embodiment is provided with an additional vacuum line 16 to evacuate the space 18.

In the operation, at the step (2) described with respect to the first embodiment, the space 18 is evacuated by the vacuum line 16 simultaneously with evacuating the spaces 14 and 15. The pressure exerted to the bottom surface of the wafer chuck 4' at this time is equal to that created if the vacuum pressure were imparted to the small area corresponding to the cross-sectional area of the opening 17a. When the diameter of the opening 17a is 1 cm, and the vacuum is 60 mmHg, for example, the pressure is as small as approximately 0.8 kg. For this reason, unlike the foregoing embodiment, it is not necessary to securely fix the wafer chuck 4' by using a mechanism. Therefore, in this embodiment, the vertical movement of the wafer chuck 4' is made easier, since only a small force is imparted thereto.

In the foregoing embodiments, the wafer chuck 4 or 4' has been described as being of an electrostatic attraction type, but they may be of a vacuum attraction type. In the latter case however, the vacuum for attracting the wafer is needed to be higher than the vacuum in the space between the mask and the wafer.

Also, the foregoing embodiments have been described with respect to the exposure apparatus for the mask and the wafer. However, this invention is applicable to an apparatus or method wherein masks are closely contacted to each other, and the pattern exposure is effected. The illumination means for the exposure may emit the ultraviolet rays or X-rays.

As described in the foregoing, according to the present invention, the gases are discharged while the two members such as a mask and a wafer are kept spaced from each other, and then the members are brought into contact or into proximity with each other, whereafter the two members are brought into close-contact with each other, then the exposure operation is performed. Therefore, the closeness of contact between the members is increased, and simultaneously, the occurrence of the pitch error is effectively prevented, so that the yield is increased while allowing a pattern exposure to a highly integrated pattern. Additionally, the throughput may be increased.

While the invention has been described with reference to the structures disclosed herein, it is not confined to the details set forth and this application is intended to cover such modifications or changes as may come within the purposes of the improvements or the scope of the following claims.

What is claimed is:

1. An apparatus wherein a first member bearing a pattern and a second member are placed in close contact facing each other and the second member is exposed to a pattern on the first member with radiation through the first member, said apparatus comprising:
   means for aligning the first and second members is a predetermined positional relation;
   means provided to cooperate with a first surface of the first member facing the second member for defining a first substantially gas-tight chamber;
   means provided to cooperate with a second surface of the first member not facing the second member for defining a second substantially gas-tight chamber which is independent of said first gas-tight chamber; and
   means for supplying a vacuum to said first and second gas-tight chambers, said vacuum supplying means being operative to maintain said first and second gas-tight chambers substantially at the same vacuum and then operative to reduce the vacuum in said second gas-tight chamber as compared with that in said first gas-tight chamber thereby bringing the first and second members into close contact with each other.

2. An apparatus according to claim 1, wherein said vacuum supplying means supplies the vacuum to said first and second gas-tight chambers at the same time.

3. An apparatus according to claim 1, wherein said vacuum supplying means is operative to reduce the vacuum in said second chamber to an atmospheric pressure level.

4. An apparatus according to claim 1, wherein said aligning means includes a holder for holding the second member and wherein said apparatus further comprises means provided to cooperate with said holder for defining a third substantially gas-tight chamber which is independent of said first and said second gas-tight chambers.

5. An apparatus according to claim 4, wherein said vacuum supplying means is operative to supply a vacuum to said third gas-tight chamber at the same time as the vacuum supplied to said first and second gas-tight chambers.

6. An apparatus according to claim 1, wherein said first gas-tight chamber defining means has a transmitting portion for allowing passage of the radiation with which the second member is exposed to the pattern of the first member.

7. An apparatus according to claim 6, wherein said aligning means includes a holder for holding the first member and wherein said first gas-tight chamber defining means has an element for elastically forcing the first member to said holder.

8. A method wherein a first member bearing a pattern and a second member are placed in close contact with each other and the second member is exposed to the pattern of the first member with radiation through the first member, said method comprising the steps of:
   aligning the first and second members in a predetermined positional relation;
   supplying a vacuum to a first substantially gas-tight chamber which includes a surface of the first member facing the second member and to a second substantially gas-tight chamber which is defined independently from said first gas-tight chamber which includes another surface of the first member not facing the second member, so that said first and said second gas-tight chambers are maintained substantially at the same vacuum; and
   reducing the vacuum in said second gas-tight chamber as compared with that in said first gas-tight chamber to bring the first and second members into close contact with each other.

9. A method according to claim 8, wherein said first and second gas-tight chambers are maintained substantially at the same vacuum while keeping a predetermined gap between the first and second members.

10. A method according to claim 9, wherein the first and second members are brought substantially into contact with each other prior to reducing the vacuum in said second gas-tight chamber.

* * * * *